(12) United States Patent
Adamec et al.

(10) Patent No.: US 8,164,067 B2
(45) Date of Patent: Apr. 24, 2012

(54) ARRANGEMENT AND METHOD FOR THE CONTRAST IMPROVEMENT IN A CHARGED PARTICLE BEAM DEVICE FOR INSPECTING A SPECIMEN

(75) Inventors: Pavel Adamec, Haar (DE); Helmut Banzhof, Poing (DE); Ivo Liska, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 302 days.

(21) Appl. No.: 12/701,463

(22) Filed: Feb. 5, 2010

(65) Prior Publication Data
US 2010/0200748 A1  Aug. 12, 2010

(30) Foreign Application Priority Data
Feb. 12, 2009  (EP) ..................... 09152717

(51) Int. Cl.
*G01N 23/22* (2006.01)
*G01N 23/00* (2006.01)
(52) U.S. Cl. ............... 250/397; 250/399; 250/492.3
(58) Field of Classification Search ............ 250/306, 250/307, 309–311, 396 R, 397, 399, 492.2, 250/492.21, 492.3
See application file for complete search history.

(56) References Cited

U.S. PATENT DOCUMENTS

| | | | |
|---|---|---|---|
| 6,498,345 B1 | 12/2002 | Weimer et al. | |
| 2002/0079449 A1 | 6/2002 | Krijn et al. | |
| 2006/0011833 A1* | 1/2006 | Ren | 250/310 |
| 2006/0076489 A1 | 4/2006 | Ohshima et al. | |
| 2009/0200463 A1* | 8/2009 | Degenhardt et al. | 250/307 |

FOREIGN PATENT DOCUMENTS

| | | |
|---|---|---|
| EP | 1288996 A1 | 3/2003 |
| EP | 1703537 A1 | 9/2006 |
| EP | 1703538 A1 | 9/2006 |
| JP | 2008-153158 | 7/2008 |

OTHER PUBLICATIONS

EPO Office Action dated Mar. 10, 2011 for European Patent Application No. 09152717.6.
Miroslav Horacek, "Detection of the Angular Distribution of the Signal Electrons in VLESEM", Journal of Computer-Assisted Microscopy, vol. 10, No. 1, Mar. 1998, pp. 23-32, XP 009098872, Plenum Publishing Corporation.
Extended European Search Report, EP 09152717.6, Apr. 29, 2009.

* cited by examiner

*Primary Examiner* — Bernard E Souw
(74) *Attorney, Agent, or Firm* — Patterson & Sheridan, LLP

(57) ABSTRACT

It is provided a charged particle beam device for inspecting a specimen, comprising a charged particle beam source adapted to generate a primary charged particle beam; an objective lens device adapted to direct the primary charged particle beam onto the specimen; and a detector device comprising one or more charged particle detectors adapted to detect a secondary charged particle beam generated by the primary charged particle beam at the specimen and passing through the objective lens device, the secondary charged particle beam comprising a first group of secondary charged particles starting from the specimen with high starting angles and a second group of secondary charged particles starting from the specimen with low starting angles; wherein at least one of the charged particle detectors is adapted to detect depending on the starting angles one group of the first and the second groups of secondary charged particles.

22 Claims, 7 Drawing Sheets

ARRANGEMENT AND METHOD FOR THE CONTRAST IMPROVEMENT IN A CHARGED PARTICLE BEAM DEVICE FOR INSPECTING A SPECIMEN

FIELD OF THE INVENTION

The invention generally relates to a charged particle beam device and a method of imaging specimen with a charged particle beam, particularly for inspection applications, testing applications, lithography applications and the like. More particularly, it relates to an improvement of the contrast, especially topographic contrast in scanning beam instruments. Specifically, it relates to a charged particle beam device and a method of inspecting a specimen with a charged particle beam device.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for inspecting specimens within the micrometer and nanometer scale.

Micrometer and nanometer scale process control, inspection or structuring, is often done with charged particle beams, e.g. electron beams or ion beams, which are generated and focused in charged particle beam devices, such as Scanning Electron Microscopes (SEM) or Focused Ion Beam (FIB) tools. Charged particle beams offer superior spatial resolution compared to e.g. photon beams, due to their short wavelengths.

A prominent tool for inspections is the Scanning Electron Microscope (SEM), an example of which is shown in FIG. 1. The SEM 1 uses a primary electron beam 7 as a means to probe the surface structure of a given specimen 3. An interaction of the primary electron beam 7 with the specimen 3 causes secondary electrons 17 to be released into a backward direction with respect to the primary electron beam 7 where they are detected by an electron detector 15. By scanning the primary electron beam across the specimen 3 and determining the rate of the released secondary electrons at each scan position, an image of the surface of the specimen 3 with high spatial resolution is obtained. The spatial resolution of the image is essentially given by the size of the beam focus.

While a SEM uses a focused primary electron beam to image a specimen, a FIB instead uses a focused primary ion beam, typically gallium ions. During scanning of the primary ion beam over the specimen, secondary electrons and ions are generated which may be collected to form an image of the surface of the specimen. The FIB can also be incorporated in a system with both electron and ion beam columns, allowing the same feature to be investigated using either of the beams.

For detection and classification of topographic defects, like particles, at the surface of specimens, a good topographic contrast is necessary. In scanning beam applications, topographic contrast may be obtained by detection of secondary electrons or ions having different starting angles from the specimen. In scanning beam tools the secondary electrons or ions produced at the specimen are usually collected over a broad range of starting angles for imaging the specimen. When using for instance a low energy SEM utilizing a retarding field objective lens for imaging a specimen, substantially all secondary electrons produced at the surface of the specimen may be attracted inside the objective lens and may therefore be detected.

SUMMARY OF THE INVENTION

In light of the above, a charged particle beam device according to claim 1 and a method of inspecting a specimen with a charged particle beam device according to claim 10 are provided.

According to one embodiment, a charged particle beam device for inspecting a specimen includes a charged particle beam source adapted to generate a primary charged particle beam; an objective lens device adapted to direct the primary charged particle beam onto the specimen; a detector device including one or more charged particle detectors adapted to detect a secondary charged particle beam generated by the primary charged particle beam at the specimen and passing through the objective lens device, the secondary charged particle beam including a first group of secondary charged particles starting from the specimen with high starting angles and a second group of secondary charged particles starting from the specimen with low starting angles; wherein at least one of the charged particle detectors is adapted to detect depending on the starting angles one group of the first and the second groups of secondary charged particles.

According to another embodiment, a method of inspecting a specimen with a charged particle beam device includes generating a primary charged particle beam; directing the primary charged particle beam onto the specimen using an objective lens device; generating a secondary charged particle beam by the primary charged particle beam at the specimen, the secondary charged particle beam including a first group of secondary charged particles starting from the specimen with high starting angles and a second group of secondary charged particles starting from the specimen with low starting angles; and detecting depending on the starting angles at least one group of the first and the second groups of secondary charged particles passing through the objective lens device.

According to a further embodiment, a charged particle beam device for inspecting a specimen includes a charged particle beam source adapted to generate a primary charged particle beam; an objective lens device adapted to direct the primary charged particle beam onto the specimen; a detector device including one or more charged particle detectors adapted to detect a secondary charged particle beam generated by the primary charged particle beam at the specimen and passing through the objective lens device, the secondary charged particle beam including a first group of secondary charged particles starting from the specimen with high starting angles and a second group of secondary charged particles starting from the specimen with low starting angles; wherein one of the charged particle detectors is adapted to detect depending on the starting angles the first group of secondary charged particles and another one of the charged particle detectors is adapted to detect depending on the starting angles the second group of secondary charged particles.

Further advantages, features, and details are evident from the dependent claims, the description and the drawings.

Embodiments are also directed to apparatuses for carrying out the disclosed methods and including apparatus parts for performing described method steps. Furthermore, embodiments are also directed to methods by which the described apparatus operates or by which the described apparatus is manufactured. It may include method steps for carrying out functions of the apparatus or manufacturing parts of the apparatus. The method steps may be performed by way of hardware components, firmware, software, a computer programmed by appropriate software, by any combination thereof or in any other manner.

BRIEF DESCRIPTION OF THE DRAWINGS

So that the manner in which the above recited features can be understood in detail, a more particular description of embodiments, briefly summarized above, may be had by reference to embodiments. The accompanying drawings relate to embodiments of the invention and are described in the following. It is contemplated that elements of one embodiment may be advantageously utilized in other embodiments without further recitation.

Some of the above mentioned embodiments will be described in more detail in the following description of typical embodiments with reference to the following drawings in which.

DETAILED DESCRIPTION OF THE DRAWINGS

Reference will now be made in detail to the various embodiments, one or more examples of which are illustrated in the figures. Each example is provided by way of explanation, and is not meant as a limitation of the invention.

Without limiting the scope of the present application, in the following the examples of embodiments described herein include a secondary electron microscope (SEM) as a typical charged particle beam device for inspecting a specimen. However, the examples and embodiments described herein may also be applied to other charged particle beam devices, in particular scanning charged particle beam devices, such as FIB. Hence, the examples and embodiments described in the following may be used for inspecting a specimen using electrons or ions as primary and/or secondary charged particle beams. Furthermore, the examples and embodiments of SEMs described herein include a combined magnetic and electrostatic objective lens designed as a retarding field objective lens. The embodiments may, however, also be applied to charged particle devices, e.g. SEMS, including other types of objective lenses, e.g. a magnetic objective lens, an electrostatic objective lens, and a combined magnetic and electrostatic objective lens not utilizing a retarding field. As described herein, reference to secondary particles or a secondary charged particle beam can be understood as reference to any secondary and/or backscattered particles or beams of secondary and/or backscattered particles, respectively.

Within the following description of the drawings, the same reference numbers refer to the same components. Generally, only the differences with respect to the individual embodiments are described.

A typical application of a charged particle beam device for inspecting a specimen according to examples of embodiments described herein is the inspection of device structures in semiconductor industry. For example, a "specimen" as referred to herein, includes, but is not limited to, wafers, semiconductor devices, other electronic components, and solar cells. Other specimens requiring a micrometer and nanometer scale process control, inspection or structuring may be contemplated.

Figure 1:
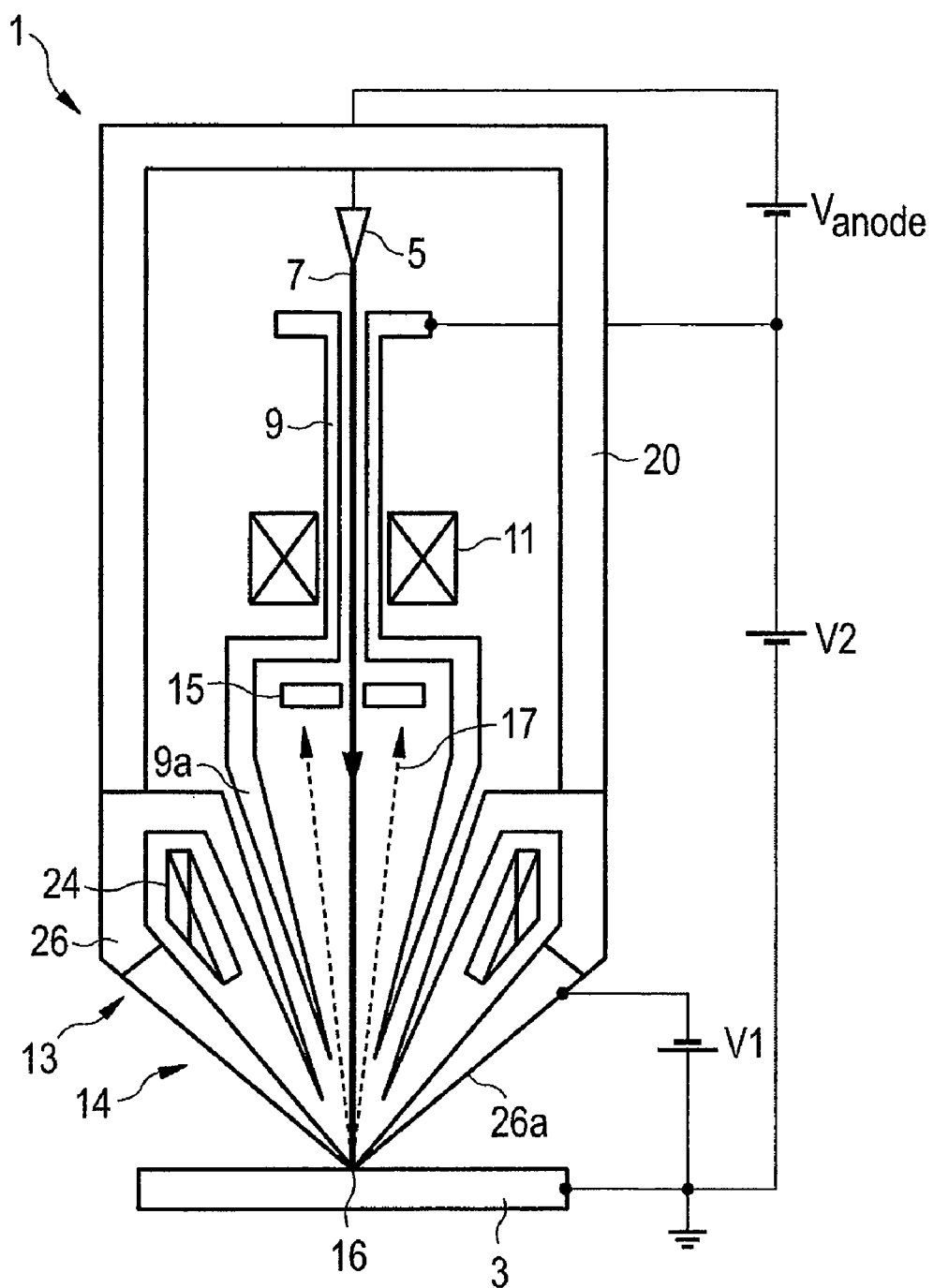
FIG. 1 shows an example of a Scanning Electron Microscope (SEM)

FIG. 1 illustrates as a typical example of a charged particle beam device a SEM 1, which includes a beam tube 20 having an electron beam source 5, e.g. a thermal field emission cathode, to generate a primary electron beam 7, a high voltage beam tube 9 to accelerate the primary electron beam 7 up to an energy controlled by an anode voltage $V_{anode}$, a condenser 11 to improve the electron beam shape, a magnetic focusing lens 13 and an electrostatic focusing lens 14 to focus the primary electron beam 7 onto a specimen 3. The SEM 1 of FIG. 1 further includes an in-lens detector 15, e.g. a position sensitive detector, to detect and evaluate the signal of the secondary electrons 17 which are generated by the primary electron beam 7 on the specimen 3.

The magnetic focusing lens 13 of FIG. 1 consists of a coil 24 and a yoke 26 shaped to generate a focusing magnetic field for the primary electron beam 7. The electrostatic focusing lens 14 of FIG. 1 is comprised of the lower-end elements 9a of the high voltage beam tube 9, the cone-like shaped elements 26a, i.e. conical cap, of yoke 26, and apertures 16 at the apices of the respective elements. The focusing electric field is defined by the geometry of the lower-end element 9a, of the conical cap, their apertures 16 and by the voltages V1 and V2 between the specimen 3 and, respectively, the conical cap 26a and the high voltage beam tube 9. If the electric field between the conical cap 26a and specimen 3 is adjusted in such a way that it decelerates the primary electron beam 7, i.e. if a retarding electrical field is employed, the spatial resolution of the probing primary electron beam can be increased when combined with a magnetic focusing field. More details about the combined electrostatic and magnetic focusing lens, and about the SEM of FIG. 1 in general, can be found in "*High Precision electron optical system for absolute and CD-measurements on large specimens*" by J. Frosien, S. Lanio, H. P. Feuerbaum, Nuclear Instruments and Methods in Physics Research A, 363 (1995), pp. 25-30.

Figure 2:
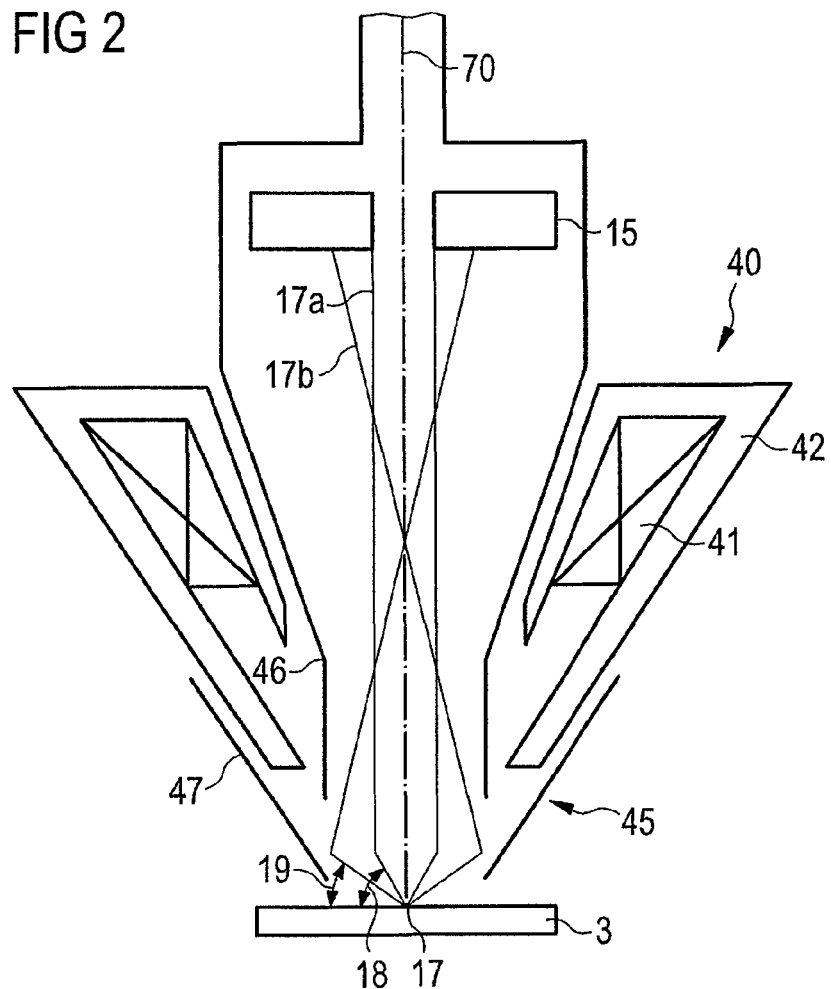
FIG. 2 illustrates a part of the SEM shown in FIG. 1.

Another typical layout of a combined electrostatic and magnetic focusing lens (herein also referred to as objective lens) used e.g. in SEM is schematically illustrated in FIG. 2. A magnetic focusing lens 40 includes a coil 41 and a yoke 42. An electrostatic immersion lens 45 may be provided with the magnetic focusing lens 40 and includes at least two electrodes 46 and 47. The first electrode 46 in the direction of the primary electron beam (not shown in FIG. 2) may have a higher potential that the second electrode 47. Thereby a retarding field for the primary electron beam travelling along the optical axis 70 may be generated, such that the primary electrons are decelerated before they strike the specimen 3. In an alternative typical layout of a SEM tool, both an electrostatic retarding field immersion lens and an electrostatic retarding field between a conical cap of an objective lens and the specimen may be employed as a primary electron decelerating means.

By decelerating the primary electron beam before impingement on the specimen, a high resolution can be obtained in a SEM due to low landing energies of the primary electrons. Low landing energies of the primary electrons, e.g. below 1 keV or even in the range of 50-100 eV, may for instance be realized in a low energy SEM employing e.g. a retarding field objective lens and an in-lens detector as described above.

Figure 3:
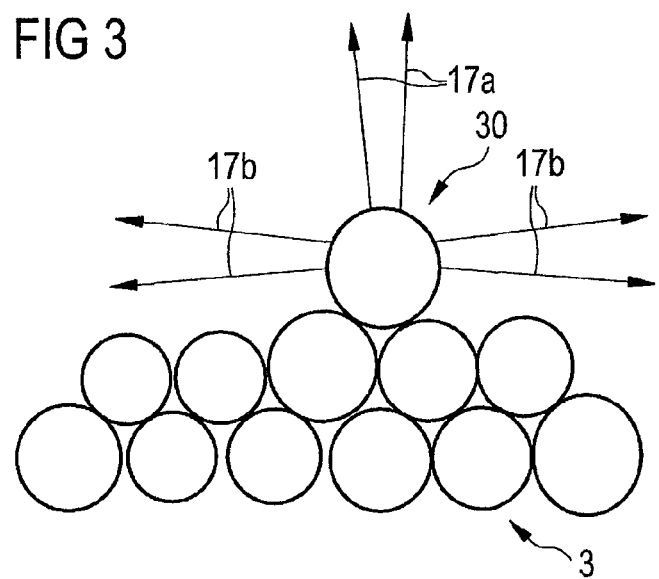
FIG. 3 shows a topography of a specimen 3.

For detection and classification of topographic defects, like particles, at the surface of specimens, a good topographic contrast is necessary. In scanning beam applications, topographic contrast may be obtained by detection of secondary or backscattered electrons with a range of starting angles from the specimen. In the following, the term "secondary electrons" also refers to backscattered electrons. As shown in FIG. 3, interaction of a primary charged particle beam with a particle 30 at the surface of the specimen 3 may result in secondary electrons 17a, 17b having varying starting angles. Typically, the secondary electrons 17b leaving the specimen 3 at starting angles of 0° to about 30° carry topographic information. The secondary electrons 17a, which have starting angles of about 30 to 50° or more, typically provide less information about the topography on the surface of the specimen 3. However, when using for instance a low energy SEM utilizing a retarding field objective lens for imaging a specimen, substantially all secondary electrons produced at the surface of the specimen may be attracted inside the objective lens and may therefore be detected.

As shown schematically in FIG. 2, secondary electrons 17 released at the specimen 3 after impingement of the primary electrons pass through the combined magnetic and electrostatic objective lens 40, 45. Due to magnetic and electrical fields of the objective lens 40, 45, the secondary electrons with low and high starting angles may be focused to crossovers with different locations along the optical axis 70. Thereby, substantially two groups of secondary electrons are obtained. The first group 17a of secondary electrons has high starting angles 18 of typically about 30° to about 90°, more typically in a range of greater than about 40°, and may have a first crossover (not shown in FIG. 2) far behind the detector 15, as schematically illustrated in FIG. 2. The second group 17b of secondary electrons starts from the specimen 3 with low starting angles 19 of typically about 0 to about 40°, more typically about 0 to about 30°, most typically about 3° to about 20°. The second group 17b may be focused to a second crossover along the optical axis 70 at a location between the specimen 3 and the detector 15. Thereby, as schematically indicated in FIG. 2, not only the second group 17b of secondary electrons, but also a part of the first group 17a of the secondary electrons may be collected by the detector 15. As a result, the imaging signals obtained by the detector 15 of the charged particle device shown in FIG. 2 may not provide distinctive topographic information.

According to one typical embodiment, a charged particle beam device for inspecting a specimen is provided. The charged particle device includes a charged particle beam source adapted to generate a primary charged particle beam, an objective lens device adapted to direct the primary charged particle beam onto the specimen, and a detector device including one or more charged particle detectors adapted to detect a secondary charged particle beam generated by the primary charged particle beam at the specimen and passing through the objective lens device. The secondary charged particle beam includes a first group of secondary charged particles starting from the specimen with high starting angles and a second group of secondary charged particles starting from the specimen with low starting angles. At least one of the charged particle detectors may be adapted, e.g. positioned, to detect depending on the starting angles one group of the first and the second groups of secondary charged particles. According to one example, at least one of the charged particle detectors may be adapted, e.g. positioned, to detect depending on the starting angles at least one group of the first and the second groups of secondary charged particles. According to a further example, at least one of the charged particle detectors may be adapted, e.g. positioned, to detect depending on the starting angles the first or the second group of secondary charged particles. In a yet further example of embodiments disclosed herein, one of the charged particle detectors may be adapted, e.g. positioned, to detect depending on the starting angles the first group of secondary charged particles.

In one example of embodiments described herein, the objective lens device may be adapted to generate a first crossover of the first group of secondary charged particles and a second crossover of the second group of secondary charged particles, and/or the first charged particle detector may be positioned substantially on or adjacent to the first crossover. The objective lens device may be also referred to herein as lens device.

Figure 4:
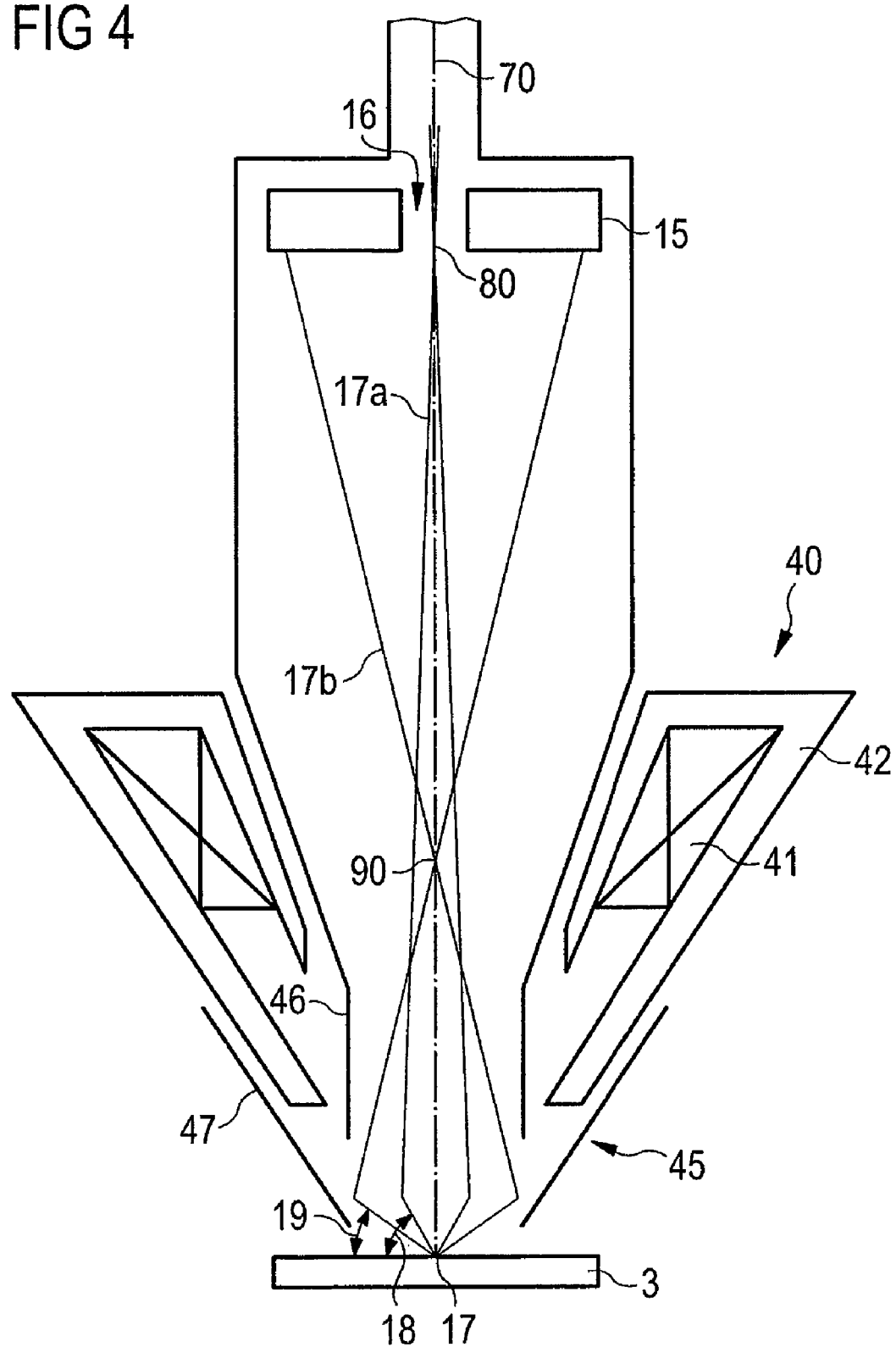
FIG. 4 shows an example of embodiments disclosed herein.

One example of embodiments disclosed herein is schematically illustrated in FIG. 4. In this Figure, a crossover 80, also referred to herein as first crossover, of the first group 17a of the secondary electrons 17, i.e. the group having high starting angles, is shown. Moreover, the second group 17b of secondary electrons, i.e. the group having low starting angles, is focused to a crossover 90, which is indicated herein as second crossover. Both crossovers 80 and 90 are generated by the lens device, which in the present example is the combined electrostatic and magnetic focusing lens (herein also referred to as objective lens) 40, 45. The distance of the crossover 80 to the specimen 3 is typically in a range of about 50 to 300 mm, more typically about 50 to 70 mm, most typically about 50 mm. Moreover, in this example the detector 15 is a position sensitive annular in-lens detector having an annular aperture 16. The annular aperture of the detector 15 may have a diameter of typically about 0.5 to 5 mm, more typically about 1 to 2 mm and most typically about 1.5 mm. If the distance of the crossover 80 to the specimen 3 is as large as about 300 mm, the annular aperture of the detector 15 may have a diameter of typically about 4 to 5 mm (Please confirm of specify). The SEM shown in FIG. 4 differs from the one shown in FIG. 2 in that the detector 15, also referred to low-angle detector, is positioned along the optical axis 70 substantially on or adjacent to the crossover 80 of the first group 17a of the secondary electrons. Hence, in the present example, the annular aperture 16 of the detector 15 substantially encompasses the crossover 80 of the first group 17a of the secondary electrons. The distance of the crossover 90 to the specimen 3 is typically in a range of about 20 to about 30 mm.

In operation of the SEM, a part of which is shown in FIG. 4, for inspection of the specimen 3, the primary electron beam (not shown) is generated along the optical axis 70 and the primary electron beam is directed onto the specimen 3 using the objective lens device 40, 45. Then, the secondary electron beam is generated by the primary electron beam at the specimen 3, substantially the entire secondary electron beam or a part thereof passing through the lens device 40, 45. The latter focuses the first group 17a of secondary electrons starting from the specimen 3 with high starting angles 18 to crossover 80 and the second group 17b of secondary electrons starting from the specimen with low starting angles 19 to crossover 90. Since the annular aperture 16 of the detector 15 substantially encompasses the crossover 80 of the first group 17a of the secondary electrons, the first group 17a of secondary electrons, i.e. the electrons having the high starting angles 18 and carrying little topographic information, pass though the detector 15 while the second group 17b of secondary electrons carrying most of the topographic information are detected by detector 15.

Hence, according to embodiments disclosed herein, a method of inspecting a specimen with a charged particle beam device includes generating a primary charged particle beam, directing the primary charged particle beam onto the specimen using an objective lens device, generating a secondary charged particle beam by the primary charged particle beam at the specimen, the secondary charged particle beam including a first group of secondary charged particles starting from the specimen with high starting angles and a second group of secondary charged particles starting from the specimen with low starting angles, and detecting depending on the starting angles at least one group of the first and the second groups of secondary charged particles passing through the objective lens device.

Consequently, the embodiments disclosed herein allow passage of secondary electrons through the objective lens of the SEM and simultaneously a discrimination of the secondary electrons by their starting angles, i.e. the angles between their initial trajectories and the specimen surface. For instance, the detection of secondary electrons with small starting angles may be emphasized while detection of secondary electrons with high starting angles may be reduced or even avoided. As a result, a charged particle beam device and a corresponding method for inspecting a specimen is obtained, which provide imaging signals with distinct contrast, more typically distinct topographic contrast.

In one typical example of embodiments disclosed herein, between the objective lens 40, 45 and the specimen 3 an extraction field of a few 100 V, typically about 100 to 3000 V/mm, more typically about 400 to about 1000 V/mm may be employed, most typically of about 1000 V/mm.

In modifications of examples of embodiments disclosed herein, the detector 15 may include at least one element selected from the group consisting of an in-lens detector, a detector positioned outside of the lens, an annular detector, a segmented detector, a fiber optic based detector, a position sensitive detector, a detector including an array of detection diodes, and a retarding field analyzer. Hence, the detector may be of simple annular shape, or may have any other structure allowing discrimination between a central area and outside area of the electron illumination. The segmented detector may be divided in individual segments, e.g. segments for top or left or right perspective of the imaging signals. Furthermore, the detector 15 may possess any combination of the typical characteristics of the aforementioned detectors.

According to one example of embodiments disclosed herein, the discrimination on the detector 15 may be based on the electrostatic retarding field of a retarding field analyzer. In this case, the secondary electrons having high starting angles, i.e. group 17a, may pass the detector 15, while the secondary electrons having low starting angles, i.e. group 17b, may be reflected by the detector 15 and directed to a detection unit of the detector 15.

Moreover, the objective lens device of examples of embodiments disclosed herein may include at least one element of the group consisting of a retarding field lens, a focusing lens, a magnetic lens, an electrostatic lens, and an electrostatic-magnetic lens. The charged particle beam device may further include a beam deflection device, a secondary charged particle beam deflection device, a transfer lens device, and a transfer lens device in combination with a secondary charged particle beam deflection device.

Figure 5:
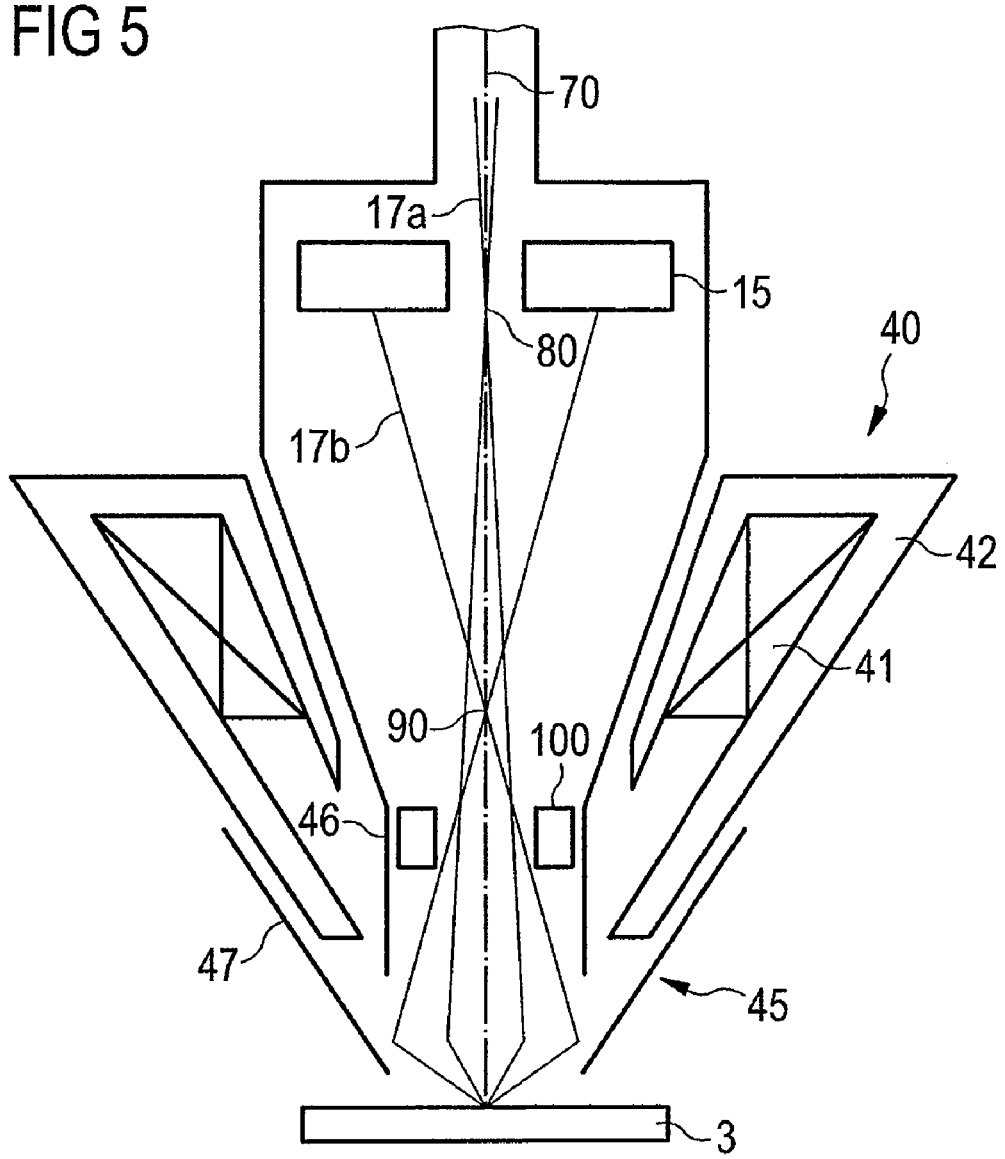
FIG. 5 shows an example of embodiments disclosed herein.

According to a further example of embodiments disclosed herein and shown in FIG. 5, the objective lens 40, 45 may include a focusing device 100, e.g. an electrostatic and/or magnetic focusing lens. The focusing device 100 may be positioned along the optical axis 70 between the specimen 3 and the crossover 90 of the second group 17b of secondary electrons. The focusing device focuses both groups 17a and 17b, in order to shorten the distance between the crossovers 90 and 80, respectively, of the first and the second group of secondary electrons and the specimen 3. Thereby, the positions of the crossover 80 and, hence, of the detector 15 may be modified, such that the distance thereof to the specimen 3 is in a desired range for optimizing the layout of the SEM.

Figure 6:
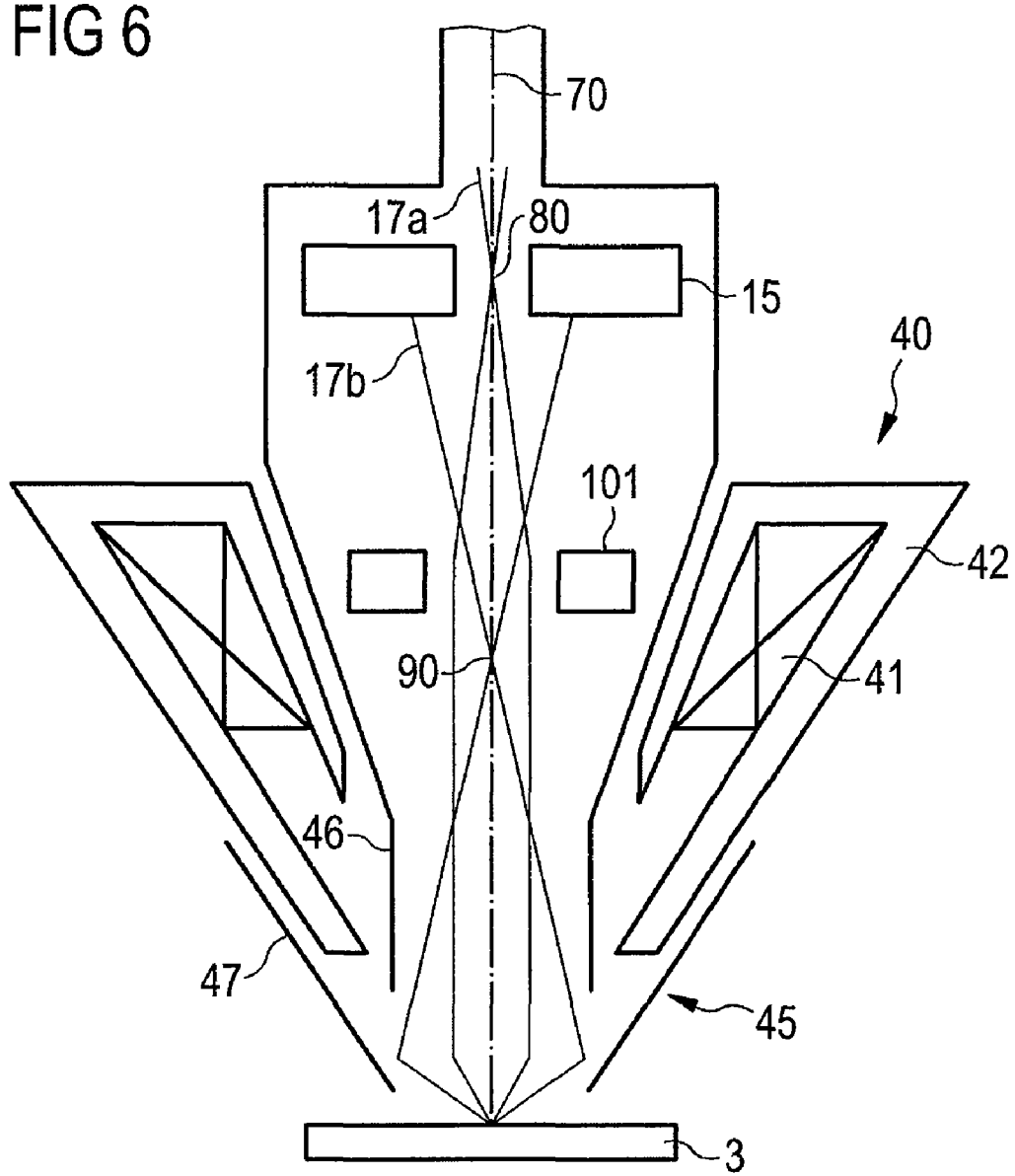
FIG. 6 shows an example of embodiments disclosed herein.

According to another example of embodiments disclosed herein and shown in FIG. 6, the objective lens 40, 45 may include a focusing device 101, e.g. a magnetic and/or electrostatic lens, positioned along the optical axis 70 between the crossover 90 of the second group 17b of secondary electrons and the detector 15. Thereby, the first and the second groups 17a and 17b of secondary electrons are further focused before arriving at the detector 15. As a consequence, only the distance between the crossover 80 of the first group of secondary electrons and the specimen 3 may be shortened to result in an optimal layout of the SEM.

Further, the positions of the crossovers 80 and/or 90 and the distances between them and the specimen 3 may also be modified using other devices influencing the first and the second groups 17a and 17b of secondary electrons, typically by magnetic and/or electrostatic fields. Thereby, in another example of embodiments disclosed herein, the distance between the crossovers 80 and/or 90 and the specimen 3 may be increased, if desired for optimizing the layout of the SEM.

In one example of embodiments disclosed herein, a charged particle beam device for inspecting a specimen includes a charged particle beam source adapted to generate a primary charged particle beam; an objective lens device adapted to direct the primary charged particle beam onto the specimen; and a detector device including one or more charged particle detectors adapted to detect a secondary charged particle beam generated by the primary charged particle beam at the specimen and passing through the objective lens device, the secondary charged particle beam including a first group of secondary charged particles starting from the specimen with high starting angles and a second group of secondary charged particles starting from the specimen with low starting angles; wherein one of the charged particle detectors is adapted, e.g. positioned, to detect depending on the starting angles the first group of secondary charged particles and another one of the charged particle detectors is adapted, e.g. positioned, to detect depending on the starting angles the second group of secondary charged particles.

According to a further example of embodiments described herein, a second charged particle detector may be provided, the second charged particle detector being positioned distant from the first and the second crossover, the first crossover being positioned between the second crossover and the second charged particle detector. Moreover, in a corresponding method of inspecting a specimen, the first group of secondary charged particles is detected at a position distant from the first and the second crossovers, the first crossover being positioned between the second crossover and the position at which the first group of secondary charged particles is detected.

Figure 7:
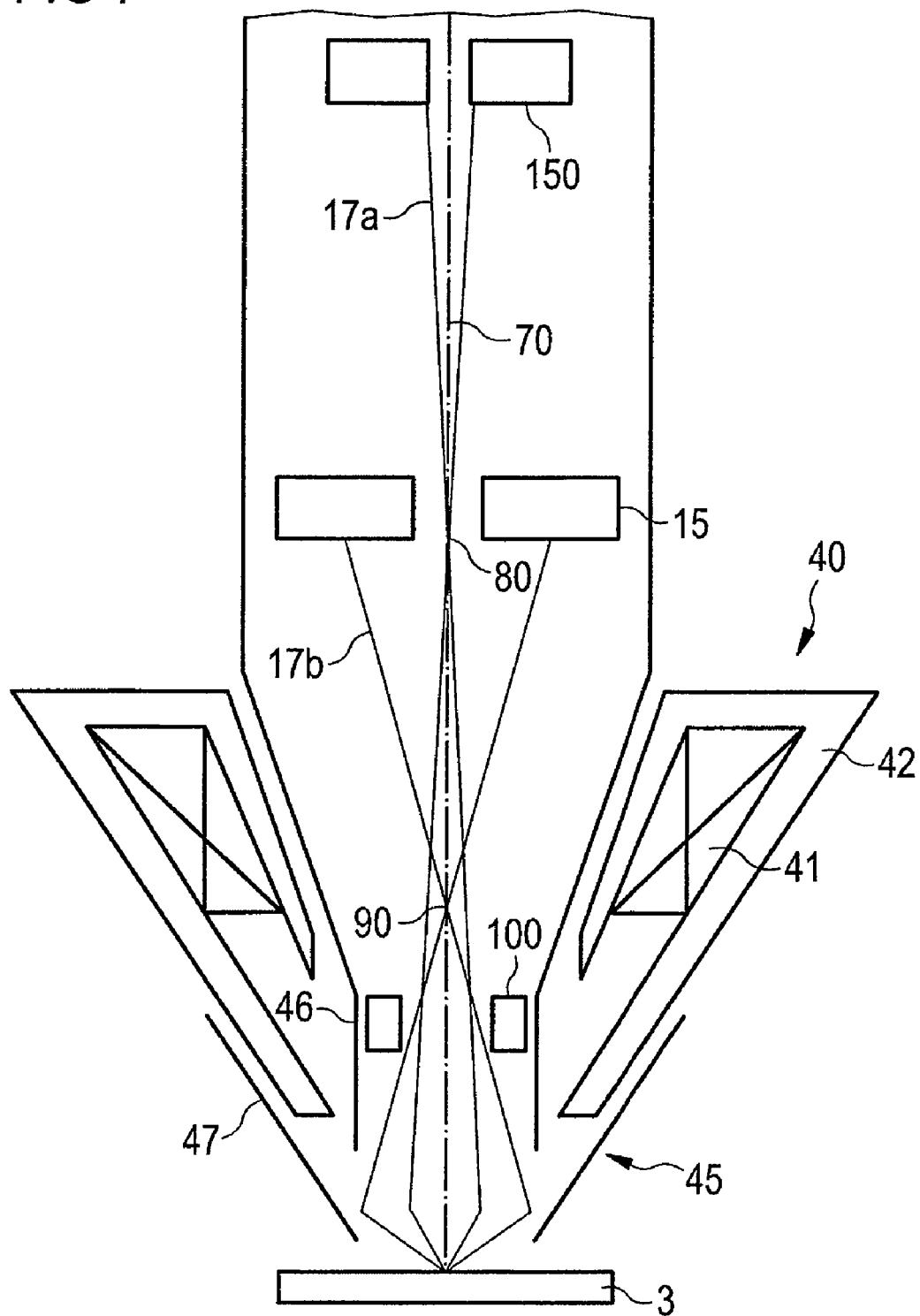
FIG. 7 shows an example of embodiments disclosed herein.

The above example of embodiments is illustrated in FIG. 7. This example differs from the example shown in FIG. 5 in that a second detector 150, also referred to as high angle detector, is provided along the optical axis 70 at a position to detect the first group 17a of secondary electrons having high starting angles. The detector 150 is typically a position sensitive in-line detector. More typically the detector 150 may be an annular detector, as shown in FIG. 7, or may be any of the detectors listed above for the detector 15. In the present example, the first crossover 80 and, hence, the first detector 15, is provided between the second crossover 90 and the second detector 150. Thereby, also the first group 17a of secondary electrons passing through the annular aperture 16 of the detector 15 may be detected for imaging of the specimen 3. These secondary electrons have high starting angles and carry little topographic information. However, the secondary electrons of the first group 17a may provide information about the localization of the edges and are thus suitable for Critical Dimensions (CD) measurements. Hence, according to the present example, both groups 17a and 17b of secondary electrons may be detected in one imaging tool allowing discrimination of the electrons by their starting angles and detailed imaging.

Moreover, in the present example, only the first group 17a of secondary electrons may be detected by operating only the detector 150. Further, according to a variation of this example, only the detector 150 of the detectors 15 and 150 shown in FIG. 7 may be provided, such that only the first group 17a of secondary electrons is detected.

In another example of embodiments disclosed herein, the charged particle beam device includes a beam separation device adapted to separate the primary particle beam from at least one group of the first and the second group of secondary charged particles. Furthermore, the charged particle beam source may be adapted to generate the primary charged particle beam along a first optical axis. The charged particle beam device further may include a transfer lens device positioned adjacent to the beam separation device and adapted to direct the at least one group of the first and the second group of secondary charged particles in a direction along a second optical axis, and at least one of the first and the second charged particle detectors may be positioned along the second optical axis.

Figure 8:
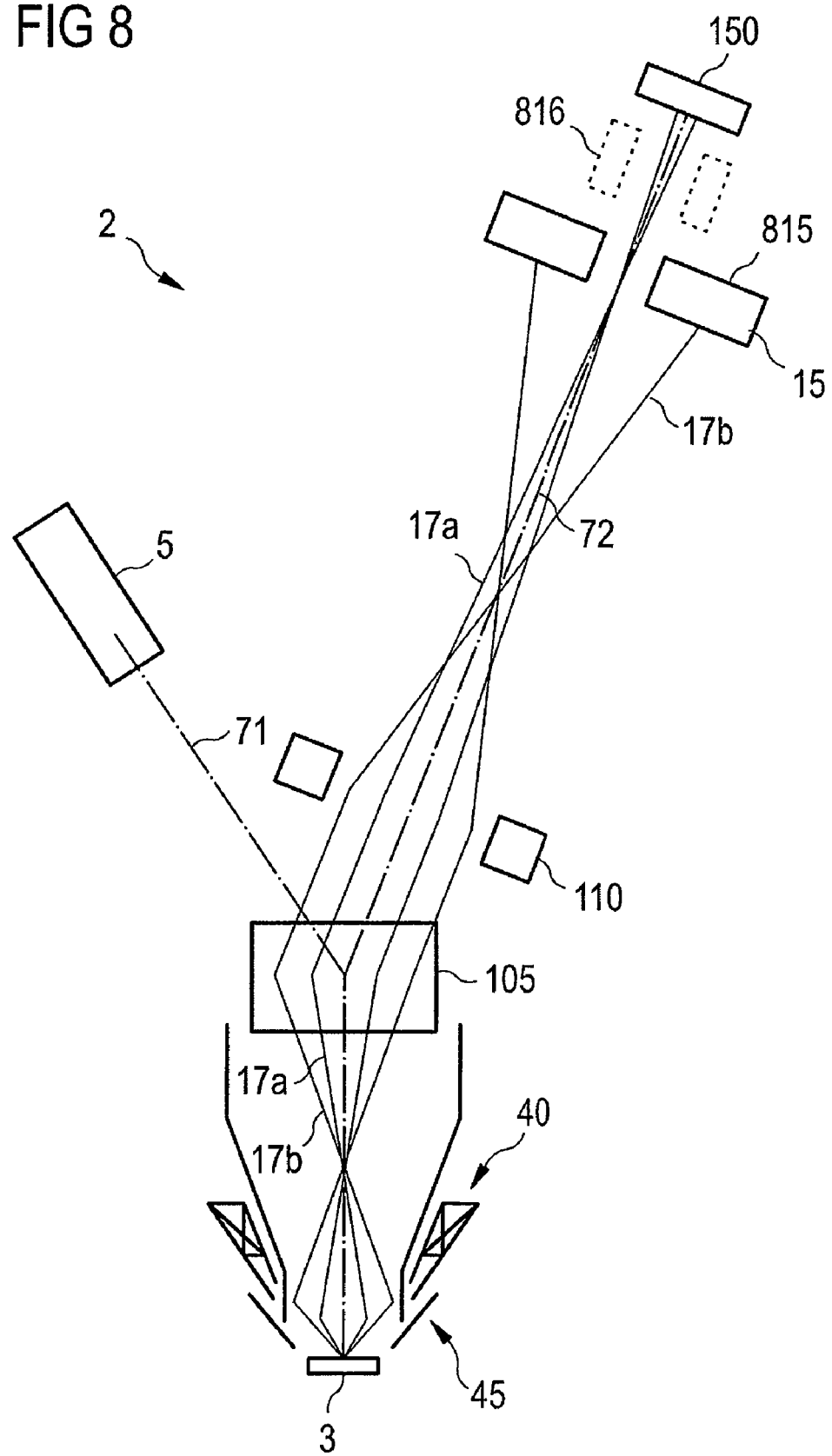
FIG. 8 shows an example of embodiments disclosed herein.

According to one example of embodiments disclosed herein and schematically shown in FIG. 8, an SEM 2 may include an electron beam source 5 generating a primary electron beam along a first optical axis 71. Furthermore, a beam separation device 105 is provided, which includes a first beam deflector (not shown) for deflecting the primary electron beam into the combined electrostatic and magnetic lens 40, 45, which focuses the primary electron beam onto the specimen 3. The beam separation device 105 includes a second beam deflector (not shown) for deflecting the first and second group 17a, 17b of secondary electrons along a second optical axis 72. A transfer lens device 110, which may include an electrostatic and/or magnetic focusing lens, may be positioned adjacent to the beam separation device 105. Furthermore, the detectors 15 and 150 are provided along the second optical axis 72 in an analogous manner as described above and shown in FIG. 7.

Hence, according to one example, the objective lens device includes the combined electrostatic and magnetic lens 40, 45, the beam separation device 105, and the transfer lens device 110.

In operation, the SEM 2 generates the primary electron beam along the first optical axis 71. The beam separation device 105 deflects the primary electron beam into the combined electrostatic and magnetic lens 40, 45, which focuses the primary electron beam onto the specimen 3. The first group 17a of secondary charged particles starting from the specimen 3 with high starting angles and the second group 17b of secondary charged particles starting from the specimen with low starting angles pass through the objective lens 40, 45 into the beam separation device 105. The beam separation device 105 deflects the first and second group 17a, 17b of secondary electrons in a direction along the second optical axis 72. The transfer lens device 110 focuses the at least one group of the first and the second group of secondary charged particles along the second optical axis 72 and produces the first and the second crossovers 80 and 90 along, typically on, the second optical axis 72.

The beam separation device 105 may include at least one element selected from the group of a deflector, a magnetic deflector, a sector field deflection unit, a combination of two, three or four magnetic deflectors (so-called 2B, 3B, or 4B deflectors), a combination of a magnetic and an electrostatic deflector, e.g. a Wien filter, and a dispersion free combined magnetic-electrostatic deflection unit. Furthermore, in the beam separation device 105 a deflection enhancing unit may be included, which is positioned and adapted to further deflect at least one group of the first and the second groups of secondary charged particles after the separation of the primary particle beam from the at least one group of the first and the second groups of secondary charged particles. Hence, the deflection of the secondary electrons may be further enhanced by a deflector included in the beam separation device 105 influencing only the secondary electrons after beam separation in the beam separation device 105.

According to a modification of the present example of embodiments disclosed herein, only one group of the first and the second groups of secondary electrons may be deflected along the second optical axis after the separation from the primary particle beam.

Further embodiments described herein may be provided with a retarding field analyzer as, e.g., shown in FIG. 8. Within FIG. 8, the back side of detector 15, i.e. the side of detector 15 opposing detector 150, can be provided with a detection surface such as a scintillator. Thereby, a further detector 815 can be provided in the system. As a further optional modification (see dotted lines) a beam divider 816 can be provided between the detector 15 and the detector 150. Accordingly, charged particles, e.g. secondary and/or backscattered charged particles, pass through the middle hole of the reverse detector 815 on their way to the divider 816. The divider's potential is such that it forms a potential barrier (potential hill, potential saddle) within the divider. High energy electrons are able overcome this potential barrier and keep propagating to the detector 150. The low energy particles are too slow to overcome the potential barrier and are accelerated back to the reverse detector 815. According to yet further embodiments, a grid or another element generating a potential barrier can be provided instead of the divider 816. Generally, a retarding field analyzer having an even further detection surface as e.g. provided by the reverse detector 815 and a beam divider, a grid or the like can be provided in any of the embodiments described above, particularly for those embodiments, wherein a beam of secondary particles passes through an opening of a detector.

According to typical embodiments, which can be combined with other embodiments described herein, the retarding field analyzer may include a divider adapted to divide a beam of charged particles into a low energy beam and a high energy beam, a front detector for detecting the high energy beam, and at least one reverse detector for detecting the low energy beam, wherein the divider is positioned between the front detector and the at least one reverse detector, and wherein, for example the front detector and/or the at least one reverse detector are segmented.

Further examples of such analyzing systems are described in U.S. patent application Ser. No. 11/384,044, filed Mar. 17, 2006, which has been published as U.S. 2006/0226361, and being entitled "Analyzing system and charged particle beam device", which is incorporated herein by reference to the extent the applications are not inconsistent with this disclosure.

As described above, due to the beam separation device of the present example, the primary electron beam may be separated from at least one group of the first and the second groups of secondary electrons. Hence, the first and/or the second group of secondary electrons may be directed along an optical axis which is different from the optical axis of the primary electron beam. This is especially applicable in cases of a charged particle beam device, in which it is not suitable or impossible to place a detector on or adjacent to the crossover of the high starting angles electrons or along the optical axis of the primary electron beam.

Consequently, the embodiments disclosed herein allow passage of secondary electrons through the objective lens of the SEM and simultaneously a discrimination of the passing secondary electrons by their starting angles, i.e. the angles between their initial trajectories and the specimen surface. For instance, the detection of secondary electrons with small starting angles may be emphasized while detection of secondary electrons with high starting angles may be reduced or even avoided. Alternatively or in addition, the secondary electrons with high starting angles passing through the detector, which collects secondary electrons with small starting angles, may be detected for imaging of the specimen. The secondary electrons having high starting angles may provide information about the localization of the edges and are thus suitable for Critical Dimensions (CD) measurements. As a result, a charged particle beam device and a corresponding method for inspecting a specimen are obtained, which provide imaging signals with distinct contrast, e.g. distinct topographic contrast, and/or edge localization information. Furthermore, by using low landing energies of the primary charged particles, a high resolution can be obtained in the embodiments of a charged particle device and a corresponding method for inspecting a specimen.

According to one embodiment disclosed herein, a charged particle beam device for inspecting a specimen includes a charged particle beam source adapted to generate a primary charged particle beam; an objective lens device adapted to direct the primary charged particle beam onto the specimen; and a detector device including one or more charged particle detectors adapted to detect a secondary charged particle beam generated by the primary charged particle beam at the specimen and passing through the objective lens device, the secondary charged particle beam including a first group of secondary charged particles starting from the specimen with high starting angles and a second group of secondary charged particles starting from the specimen with low starting angles; wherein at least one of the one or more charged particle detectors is adapted to detect depending on the starting angles one group of the first and the second groups of secondary charged particles.

In a modification of any of the above one embodiment, the objective lens device may be adapted to generate a first crossover of the first group of secondary charged particles and a second crossover of the second group of secondary charged particles.

In a modification of any of the above one embodiment and modification thereof, a first charged particle detector of the one or more charged particle detectors is positioned substantially on or adjacent to the first crossover.

In a modification of any of the above one embodiment and modifications thereof, a second charged particle detector of the one or more charged particle detectors may be positioned distant from the first and the second crossover, the first crossover being positioned between the second crossover and the second charged particle detector.

In a modification of any of the above one embodiment and modifications thereof, one or more of the charged particle detectors may include at least one element selected from the group consisting of an in-lens detector, a detector positioned outside of the lens, an annular detector, a segmented detector, a fiber optic based detector, a position sensitive detector, a detector including an array of detection diodes, and a retarding field detector.

In a modification of any of the above one embodiment and modifications thereof, the objective lens device may include at least one element of the group consisting of a retarding field lens, a focusing lens, a magnetic lens, an electrostatic lens, and an electrostatic-magnetic lens.

In a modification of any of the above one embodiment and modifications thereof, which may be combined with any other embodiment and/or modification described herein, the charged particle beam device further includes a beam deflection device, a secondary charged particle beam deflection device, a transfer lens device, a transfer lens device in combination with a secondary charged particle beam deflection device, and a beam separation device adapted to separate the primary particle beam from at least one group of the first and the second group of secondary charged particles.

In a modification of any of the above one embodiment and modifications thereof, the charged particle beam source is adapted to generate the primary charged particle beam along a first optical axis, the charged particle beam device further includes a beam separation device adapted to separate the primary particle beam from at least one group of the first and the second group of secondary charged particles, and a transfer lens device positioned adjacent to the beam separation device and adapted to direct the at least one group of the first and the second group of secondary charged particles in a direction along a second optical axis, and wherein at least one of the first and the second charged particle detectors is positioned along the second optical axis.

In a modification of any of the above one embodiment and modifications thereof, the transfer lens device may be positioned between the beam separation device and the at least one of the first and second charged particle detectors, and/or is adapted to generate at least one of the first and the second crossovers substantially on the second optical axis.

In a modification of any of the above one embodiment and modifications thereof, the beam separation device may include at least one element selected from the group of a deflector, a magnetic deflector, a sector field deflection unit, a combination of two, three or four magnetic deflectors, a combination of a magnetic and an electrostatic deflector, a Wien filter, a dispersion free combined magnetic-electrostatic deflection unit, and a deflection enhancing unit positioned and adapted to further deflect the at least one group of the first and the second groups of secondary charged particles after the separating of the primary particle beam from the at least one group of the first and the second groups of secondary charged particles.

In a modification of any of the above one embodiment and modifications thereof, the first charged particle detector may include a retarding field analyzer adapted to reflect and/or detect the second group of secondary charged particles.

In a modification of any of the above one embodiment and modifications thereof, the first group of secondary charged particles may have starting angles in the range of 30 to 90°, and the second group of secondary charged particles may have low starting angles in the range of 0 to 30°.

In a modification of any of the above one embodiment and modifications thereof, the distance of the first crossover (80 to the specimen may be in a range of 50 to 150 mm, and the detector may be an annular detector having an annular aperture of a diameter of 0.5 to 5 mm.

In a modification of any of the above one embodiment and modifications thereof, between the objective lens device and the specimen an extraction field of 100 to 3000 V/mm may be applied.

According to a yet further embodiment, a method of inspecting a specimen with a charged particle beam device includes generating a primary charged particle beam; directing the primary charged particle beam onto the specimen using an objective lens device; generating a secondary charged particle beam by the primary charged particle beam at the specimen, the secondary charged particle beam including a first group of secondary charged particles starting from the specimen with high starting angles and a second group of secondary charged particles starting from the specimen with low starting angles; and detecting depending on the starting angles at least one group of the first and the second groups of secondary charged particles passing through the objective lens device.

In a modification of the above yet further embodiment, the objective lens device may generate a first crossover of the first group of secondary charged particles and a second crossover of the second group of secondary charged particles; and the second group of secondary charged particles is detected substantially on or adjacent to the first crossover.

In a modification of any of the above yet further embodiment and modification thereof, the first group of secondary charged particles may be detected at a position distant from the first and the second crossovers, the first crossover being positioned between the second crossover and the position at which the first group of secondary charged particles is detected.

In a modification of any of the above yet further embodiment and modifications thereof, the objective lens device includes at least one element of the group consisting of a retarding field lens, a focusing lens, a magnetic lens, an electrostatic lens, and an electrostatic-magnetic lens.

In a modification of any of the above yet further embodiment and modifications thereof, the primary charged particle beam is generated along a first optical axis, the primary particle beam is separated from at least one group of the first and the second groups of secondary charged particles and the at least one group of the first and the second groups of secondary charged particles is directed in a direction along a second optical axis, and the at least one group of the first and the second groups of secondary charged particles is detected along the second optical axis, wherein optionally at least one of the first and the second crossovers is generated substantially on the second optical axis.

In a modification of any of the above yet further embodiment and modifications thereof, the step of separating the primary particle beam may include a step of deflecting the at least one group of the first and the second groups of secondary charged particles and the primary charged particle beam in the direction along the second optical axis.

In a modification of any of the above yet further embodiment and modifications thereof, the step of separating the primary particle beam may include a step of enhancing the step of deflecting the at least one group of the first and the second groups of secondary charged particles by further deflecting the at least one group of the first and the second groups of secondary charged particles after the separation from the primary particle beam.

In a modification of any of the above yet further embodiment and modifications thereof, the second group of secondary charged particles may be reflected and/or detected by a retarding field analyzer.

In a modification of any of the above yet further embodiment and modifications thereof, the first group of secondary charged particles may have starting angles in the range of about 30 to 90°, and the second group of secondary charged particles may have starting angles in the range of 0 to 30°.

In a modification of any of the above yet further embodiment and modifications thereof, the distance of the first crossover to the specimen may be in a range of about 50 to 150 mm, typically about 70 to 120 mm, and/or the detector may be an annular detector having a diameter of an annular aperture of about 0.5 to 5 mm.

In a modification of any of the above yet further embodiment and modifications thereof, between the objective lens device and the specimen an extraction field of about 100 to about 3000 V/mm may be applied, typically of about 1000 V/mm.

In another embodiment disclosed herein, a charged particle beam device for inspecting a specimen includes a charged particle beam source adapted to generate a primary charged particle beam; an objective lens device adapted to direct the primary charged particle beam onto the specimen; and a detector device including one or more charged particle detectors adapted to detect a secondary charged particle beam generated by the primary charged particle beam at the specimen and passing through the objective lens device, the secondary charged particle beam including a first group of secondary charged particles starting from the specimen with high starting angles and a second group of secondary charged particles starting from the specimen with low starting angles; wherein one of the charged particle detectors is adapted to detect depending on the starting angles the first group of secondary charged particles and another one of the charged particle detectors is adapted to detect depending on the starting angles the second group of secondary charged particles.

The written description uses examples to disclose the invention, including the best mode, and also to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the embodiments described above may be combined with each other. The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

The invention claimed is:

1. A charged particle beam device for inspecting a specimen, comprising:
 a charged particle beam source adapted to generate a primary charged particle beam;
 an objective lens device adapted to direct the primary charged particle beam onto the specimen; and
 a detector device comprising one or more charged particle detectors adapted to detect a secondary charged particle beam generated by the primary charged particle beam at the specimen and passing through the objective lens device, the secondary charged particle beam comprising a first group of secondary charged particles starting from the specimen with high starting angles and a second group of secondary charged particles starting from the specimen with low starting angles;

wherein at least one of the one or more charged particle detectors is adapted to detect depending on the starting angles one group of the first and the second groups of secondary charged particles, wherein the objective lens device is adapted to generate a first crossover of the first group of secondary charged particles and a second crossover of the second group of secondary charged particles, and wherein a first charged particle detector of the one or more charged particle detectors is positioned substantially on or adjacent to the first crossover.

2. The device of claim 1, wherein a second charged particle detector of the one or more charged particle detectors is positioned distant from the first and the second crossover, the first crossover being positioned between the second crossover and the second charged particle detector.

3. The device of claim 1, wherein one or more of the charged particle detectors comprises at least one element selected from the group consisting of an in-lens detector, a detector positioned outside of the lens, an annular detector, a segmented detector, a fiber optic based detector, a position sensitive detector, a detector comprising an array of detection diodes, and a retarding field detector.

4. The device of claim 1, wherein the objective lens device comprises at least one element of the group consisting of a retarding field lens, a focusing lens, a magnetic lens, an electrostatic lens, an electrostatic-magnetic lens.

5. The device of claim 1, comprising at least one element of the group consisting of a beam deflection device, a secondary charged particle beam deflection device, a transfer lens device, a transfer lens device in combination with a secondary charged particle beam deflection device, and a beam separation device adapted to separate the primary particle beam from at least one group of the first and the second group of secondary charged particles.

6. The device of claim 1, wherein the charged particle beam source is adapted to generate the primary charged particle beam along a first optical axis, the charged particle beam device further comprising a beam separation device adapted to separate the primary particle beam from at least one group of the first and the second group of secondary charged particles, a transfer lens device positioned adjacent to the beam separation device and adapted to direct the at least one group of the first and the second group of secondary charged particles in a direction along a second optical axis, and wherein at least one of the first and the second charged particle detectors is positioned along the second optical axis.

7. The device of claim 6, wherein the transfer lens device is positioned between the beam separation device and the at least one of the first and second charged particle detectors, wherein the transfer lens device is optionally adapted to generate at least one of the first and the second crossovers substantially on the second optical axis.

8. The device of claim 6, wherein the beam separation device comprises at least one element selected from the group of a deflector, a magnetic deflector, a sector field deflection unit, a combination of two, three or four magnetic deflectors, a combination of a magnetic and an electrostatic deflector, a Wien filter, a dispersion free combined magnetic-electrostatic deflection unit, and a deflection enhancing unit positioned and adapted to further deflect the at least one group of the first and the second groups of secondary charged particles after the separating of the primary particle beam from the at least one group of the first and the second groups of secondary charged particles.

9. The device of claim 1, wherein the first charged particle detector comprises a retarding field analyzer adapted to reflect and optionally to detect the second group of secondary charged particles.

10. The device of claim 1, wherein the first group of secondary charged particles has starting angles in the range of 30 to 90°, and the second group of secondary charged particles has starting angles in the range of 0 to 30°.

11. The device of claim 1, wherein the distance of the first crossover to the specimen is in a range of 50 to 150 mm, and the detector is an annular detector having an annular aperture of a diameter of 0.5 to 5 mm.

12. The device of claim 1, wherein between the objective lens device and the specimen an extraction field of 100 to 3000 V/mm is applied.

13. A method of inspecting a specimen with a charged particle beam device, comprising:
generating a primary charged particle beam;
directing the primary charged particle beam onto the specimen using an objective lens device;
generating a secondary charged particle beam by the primary charged particle beam at the specimen, the secondary charged particle beam comprising a first group of secondary charged particles starting from the specimen with high starting angles and a second group of secondary charged particles starting from the specimen with low starting angles;
and detecting depending on the starting angles at least one group of the first and the second groups of secondary charged particles passing through the objective lens device, wherein the objective lens device generates a first crossover of the first group of secondary charged particles and a second crossover of the second group of secondary charged particles, and wherein the second group of secondary charged particles is detected substantially on or adjacent to the first crossover.

14. The method of claim 13, wherein the first group of secondary charged particles is detected at a position distant from the first and the second crossovers, the first crossover being positioned between the second crossover and the position at which the first group of secondary charged particles is detected.

15. The method of claim 13, wherein the objective lens device comprises at least one element of the group consisting of a retarding field lens, a focusing lens, a magnetic lens, an electrostatic lens, and an electrostatic-magnetic lens.

16. The method of claim 13, wherein the primary charged particle beam is generated along a first optical axis, the primary particle beam is separated from at least one group of the first and the second groups of secondary charged particles and the at least one group of the first and the second groups of secondary charged particles is directed in a direction along a second optical axis, and the at least one group of the first and the second groups of secondary charged particles is detected along the second optical axis, wherein optionally at least one of the first and the second crossovers is generated substantially on the second optical axis.

17. The method of claim 16, wherein the step of separating the primary particle beam comprises a step of deflecting the at least one group of the first and the second groups of secondary charged particles and the primary charged particle beam in the direction along the second optical axis.

18. The method of claim 16, wherein the step of separating the primary particle beam comprises a step of enhancing the step of deflecting the at least one group of the first and the second groups of secondary charged particles by further deflecting the at least one group of the first and the second groups of secondary charged particles after the separation from the primary particle beam.

19. The method of claim 13, wherein the second group of secondary charged particles is reflected and optionally detected by a retarding field analyzer.

20. The method of claim 13, wherein the first group of secondary charged particles has starting angles in the range of 30 to 90°, and the second group of secondary charged particles has starting angles in the range of 0 to 30°.

21. The method of claim 13, wherein the distance of the first crossover to the specimen is in a range of 50 to 150 mm, and the detector is an annular detector having an annular aperture of a diameter of 0.5 to 5 mm.

22. The method of claim 13, wherein between the objective lens device and the specimen an extraction field of 100 to 3000 V/mm is applied.

* * * * *